United States Patent [19]
Pasch

[11] Patent Number: 5,872,026
[45] Date of Patent: Feb. 16, 1999

[54] PROCESS OF FABRICATING AN INTEGRATED CIRCUIT DIE PACKAGE HAVING A PLURALITY OF PINS

[75] Inventor: Nicholas F. Pasch, Pacifica, Calif.

[73] Assignee: LSI Logic Corporation, Milpitas, Calif.

[21] Appl. No.: 916,025

[22] Filed: Aug. 21, 1997

Related U.S. Application Data

[62] Division of Ser. No. 485,060, Jun. 7, 1995, Pat. No. 5,739,584.

[51] Int. Cl.$^6$ ............................ H01L 21/52; H01L 21/58; H01L 21/60
[52] U.S. Cl. ............................................ 438/109; 438/125
[58] Field of Search ................................... 438/107, 108, 438/109, 125, 375

[56] References Cited

U.S. PATENT DOCUMENTS

| | | |
|---|---|---|
| 4,231,154 | 11/1980 | Gazdik et al. . |
| 4,760,335 | 7/1988 | Lindberg . |
| 4,979,015 | 12/1990 | Stierman et al. . |
| 5,288,944 | 2/1994 | Bronston et al. . |
| 5,376,825 | 12/1994 | Tukamoto et al. . |
| 5,424,573 | 6/1995 | Kato et al. . |
| 5,506,448 | 4/1996 | Morishige . |
| 5,656,945 | 8/1997 | Cain . |

OTHER PUBLICATIONS

Lyman, "Silicon On Silicon Hybrids Are Coming Into Their Own," *Electronics*, May 28, 1987, pp. 47–48.

*Primary Examiner*—David Graybill
*Attorney, Agent, or Firm*—Oppenheimer Wolff & Donnelly LLP

[57] ABSTRACT

A process for manufacturing a modular multi-pin package for an integrated circuit die is formed of standardized parts and a redesigned, integrated circuit specific circuit substrate possessing a design pattern for providing electrical connection between die pads and output pins. The substrate includes a pattern of electrically conductive traces each terminating in a die pattern at an interior portion of the substrate and terminating in a pattern of pin connecting pads at a peripheral portion of the substrate. A pin holding frame is formed with a plurality of holes in which are inserted a selected number and pattern of package terminal pins, each having a shank protruding outwardly from the pin holder for connection to external circuits or components and each having an inner head pressed against one of the pin connecting pads of the substrate circuit traces. A conductive epoxy may be interposed between the pin heads and the substrate pin connecting pads to ensure electrical contact, and a dielectric gas impermeable adhesive may be employed to secure the pin holder frame to the substrate. A die is inserted through a central aperture of the pin holder frame for attachment to the substrate by connecting the die pads to the die connecting ends of the substrate circuit. The package is completed by bonding a gas impermeable lid of metal or a transparent material to the pin holder frame to cover the opening of the frame and seal the die within the package.

8 Claims, 2 Drawing Sheets

PROCESS OF FABRICATING AN INTEGRATED CIRCUIT DIE PACKAGE HAVING A PLURALITY OF PINS

CROSS-REFERENCE TO RELATED APPLICATION

This is a divisional of application Ser. No. 08/485,060, filed Jun. 7, 1995, U.S. Pat. No. 5,739,584.

FIELD OF THE INVENTION

The present invention relates to integrated circuit chips, or dies, and more particularly concerns an improved multiple-pin die package.

BACKGROUND OF THE INVENTION

Integrated circuit dies are generally mounted in a package that not only protects the die from the external environment itself but also facilitates electrical and physical connection of the die to a circuit board or to other external circuit components.

Generally the production of dies in quantity from silicon wafers employs processes and production facilities different from those involved in package production. Accordingly, packages, which may cost more than the die alone, are often produced at a different location or by a different fabricator. Importantly, the time for production of a package that is designed for a particular die is generally greater than the time for production of the die itself. Thus, once design of the die has been finalized the design must be transmitted to the package fabricator, which then designs and produces packages in quantity for the dies. In some instances the time required for package design and production causes undesired delays in the availability of packages, thereby slowing die production. Once the package design has been finalized any further changes only greatly increases the total time of package design and production. This is true for dies of generally standardized design. Even greater delays are incurred in post-final design changes to packages intended for dies of custom design.

To avoid delays associated with package redesigning, it is often necessary for the die manufacturer either to stock large quantities of packages for a given die or stock large quantities of packages for many different types. Design and fabrication of a specially designed package may require up to several months, whereas design and fabrication of the die itself may require only a few days. Since package fabrication is a major consideration in the time of manufacture of useful die packages, it is an object of the present invention to provide a multiple-pin die package that avoids or minimizes the above mentioned problems and delays.

SUMMARY OF THE INVENTION

In accordance with a preferred embodiment of the present invention, a multiple integrated circuit die package is provided including a pin holding frame surrounding a die, a plurality of pins extending through the frame having inner ends on one side of the frame and outer ends projecting from the other side of the frame, and a circuit substrate bonded to the frame and extending over the die and frame. The circuit substrate provides a set of conductive traces connected between the pin inner ends and connecting pads on the die. The package is completed by bonding a back plate to the substrate and covering the opening in the pin holding frame with a lid. The entire package may be sealed by utilizing gas impermeable adhesive to secure the lid to the die frame, and the die frame to the substrate.

The arrangement provides an essentially modular die package utilizing a number of easily stocked and readily available standardized components, along with only one component that may need to be uniquely designed. The standardized components of this package may include the die frame, the pins, of which there may be several different sizes, the back plate and the lid. The circuit substrate, with its conductive traces, may be uniquely designed for the individual patterns of pads of a particular integrated circuit die and for individual patterns of output package pins. Moreover, the die manufacturer, having facilities and techniques for manufacture of a number of dies on a silicon wafer, may use the same facilities and techniques for manufacture of the circuit substrate and its required conductive pattern. Accordingly, the entire package can be custom designed and fabricated within the facilities of the die fabricator and with relatively small lead time.

DESCRIPTION OF THE PREFERRED EMBODIMENTS

Figure 1:
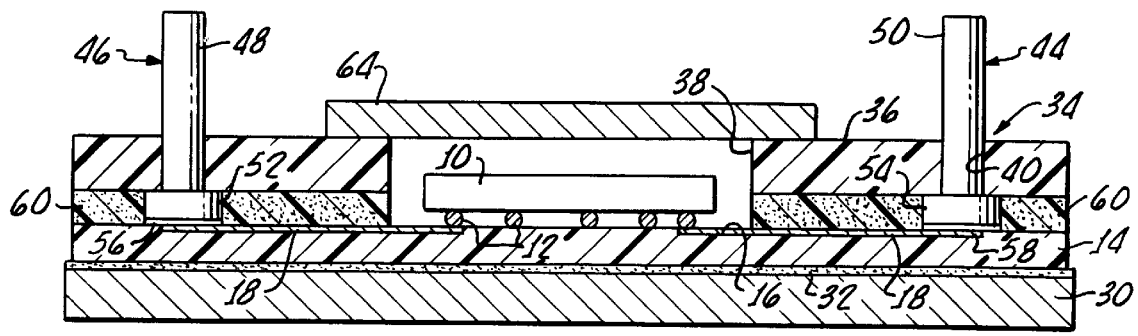
FIG. 1 is a sectional view of a multi-pin die package embodying principles of the present invention.

Illustrated in FIG. 1 is a multi-pin die package having a ball grid array for connection of the die to external circuitry. The package is shown in inverted orientation with the pins facing upwardly. The package is preferably assembled in this orientation. As the description proceeds it should be appreciated that principles of the invention are also applicable to many different types of dies, including leaded dies and TAB packaged dies and also may be applied to different types of packaging including ceramic die packages and plastic die packages.

A die 10 is electrically and physically connected by any suitable means, such as the array of solder balls 12 illustrated, to a central area of the circuit substrate 14. This substrate 14 is formed of any suitable thin material, such as, for example, a dielectric material, or of an electrically conductive material covered with a dielectric insulating layer. On the surface 16 of the substrate 14 there is formed a pattern of electrically conductive traces, such as traces 18,20, each extending from an inner end at an inner area of the substrate to an outer end at an outer peripheral area of the substrate. Thus, for example, trace 18 has an inner end that extends to an inner portion that is formed with a die contacting pad 22 (FIG. 2) and extends to an outer end connected to a pin contacting pad 24. The die includes a plurality of die pads (not shown), upon each of which is positioned one of the solder balls 12, with the die pads and solder balls being arranged in a pattern corresponding to the pattern of the array of die contacting pads 22 formed in the inner area of the surface 16 of substrate 14. A self-supporting strong and rigid back plate 30 is bonded to the substrate 14 by means of an adhesive 32 and is substantially coextensive with the entire area of the substrate. Preferably, both the substrate and the back plate, and also the bonding adhesive 32, are formed of a thermally conductive material.

A pin holding frame 34 may be formed of a thin, rigid dielectric material. The frame 34 has a peripheral area 36 extending around a central opening 38 and is formed with a plurality of pin receiving holes 40 that extend through the entire thickness of the frame, from the inside to the outside of the frame. The pin holding frame 34 also has an area that is substantially coextensive with the area of the substrate and back plate, and the central opening 38 of the frame 34 is preferably larger than the dimensions of the die 10 so as to enable the die to be readily inserted through the central opening in the pin holding frame to be positioned against and attached to the substrate.

A plurality of headed pins 44,46 may be individually inserted into the holes 40 of the pin holding frame, with the shanks 48,50 projecting outwardly away from the outer side (upper side in FIG. 1) of the pin holding frame. Each pin in this particular embodiment is formed with an enlarged diameter head 52,54, having flat end surface on which is placed a small amount of an electrically conductive adhesive 56,58.

The pattern of holes 40 of the pin holding frame 34, and, therefore, the pattern of pin heads 52,54, is congruent with the pattern of pin contacting pads 24 formed on the outer ends of the traces 18 of the substrate 14. Accordingly, the pin holding frame may be pressed against the substrate to press the heads of the pins and the conductive adhesive thereon against respective ones of the pin contacts 24 of the substrate to provide electrical connection between the pins and the traces 18 of the substrate.

A gas impermeable adhesive filler 60 is also preferably interposed between the pin holding frame 34 and the substrate 14 to bond the frame to the substrate. The adhesive filler 60 preferably surrounds the sides of the pin heads such as 52,54, extending between each of the pin heads, but does not cover any portion of the outer surface of the pin heads which receive the electrically conductive adhesive 56,58.

A rigid lid 64, which may be formed of a thin plate of metal, such as aluminum or other metal, or of transparent material, is bonded to the outer side of the pin holding frame, extending across and completely sealing the opening 38 in the frame to effectively seal the die 10 within the package between the lid, substrate and frame.

In assembly of the described package the substrate is formed with its pattern of traces, die pads and pin connecting pads. The pin holding frame 34 is formed with a plurality of apertures 40 in a pattern that is congruent with the pattern of pads 24 on the substrate. If deemed necessary or desirable, the frame may be formed with a complete set of standard regularly spaced holes covering substantially all of the peripheral area 36 thereof, and only selected ones of such holes may be filled with the pins, such as pins 46,50, to provide pin heads in a pattern congruent with the pattern of pin connecting pads 24. In this manner one type of pin holding frame may be utilized for different pin patterns.

A quantity of electrically conductive adhesive is placed on the outermost surface of each pin head, and the frame with the pins inserted therein is then pressed against the substrate, carefully aligning the pin pattern with the pattern of pin pads 24 (as by means of a conventional double sided alignment tool, for example), and thus the pins are all electrically connected to the circuit traces 18 on the substrate 14.

The filler epoxy 60 is then inserted into the gap formed between the pin holder frame and the substrate, this gap being formed by the thickness of the pin heads, which in this embodiment spaces the frame from the substrate. This filler adhesive may be injected into this gap to flow around the sides of the pin heads but not over the surfaces thereof that are covered with the conductive adhesive. This non-conductive filler adhesive 60 thus provides a gas tight seal of the connection between the substrate and the pin holding frame. It does not extend into the opening 38 of the pin holding frame.

Figure 2:
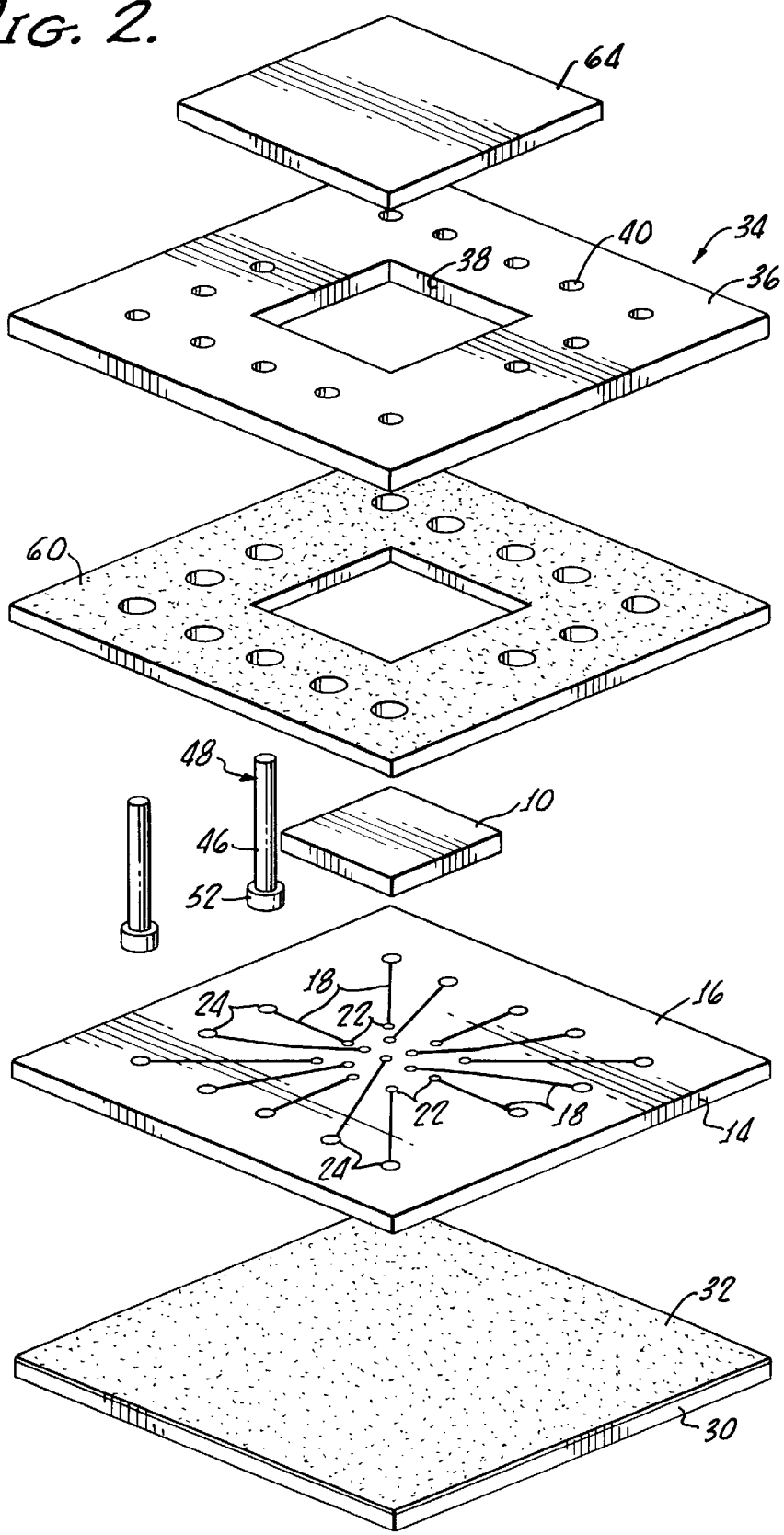
FIG. 2 is an exploded pictorial view of parts of the die package of FIG. 1.

Assembly is performed with the pin heads down and the pin shanks up, in the orientation shown in FIGS. 1 and 2. Therefore, the die with its solder balls is inserted into the aperture 38 of the pin holding frame in the illustrated face down configuration to cause the solder balls 12 to contact the respective die connecting pads 22 (FIG. 2). Solder is caused to flow by means of standard reflow soldering techniques, thereby securely attaching the die to the substrate both physically and electrically. The lid 64 is then bonded to the outer side of the pin holder frame, extending completely across the pin holder frame aperture 38 and sealing the die within the package. Alternatively, however, the die may first be mounted and tested, with the pin grid attached after the die successfully passes the testing.

Although only a single layer substrate is illustrated, it should be appreciated that the substrate may instead be made in multiple layers with multiple layers of connecting circuits, such as traces 18, formed on the differing layers of the substrate. The traces on different layers would then be connected by vias so as to provide an electrical connection for increased pad density. The substrate may also be made of various types of materials, including silicon, aluminum, alumina and others. Preferably, a material having a thermal coefficient of expansion that matches the expansion of the die material, is employed.

The pin holding frame 34 is also preferably formed of a dielectric material so as to insulate the pins from one another. If deemed necessary or desirable, connections between selected ones of the pins may be made by forming suitable electrical conductors (not shown) that are carried by the pin frame and extend from one pin hole and pin to another.

The shape of the pins illustrated in the drawings employing a relatively small diameter shank and an enlarged flat surface head is presently preferred, but may be significantly varied without deviating from the scope of the present invention. The configuration, size and materials of the pin head may further be varied as necessary to better mate with the pin connecting pads on the substrate. Further, the shank of each pin and, accordingly, the holes of the substrate of the pin holding frame, may be made of a non-circular cross-section to resist rotation or to increase bearing area. The pins may further be suitably coated to enhance adhesion to the pin holding frame. Although the pins are described as preferably electrically connected to the substrate pads 24 by means of a conductive epoxy resin, it will be readily appreciated that different methods and techniques for forming an electrical pressure connection between the pin heads and the substrate may be employed. When inserted in the pin holding frame, the pin heads, which need not be enlarged, may project by predetermined distances downwardly (as viewed in FIG. 1) from the frame. Then, when the frame is pressed toward the substrate, the projecting pin heads are pushed in to ensure that all contact the substrate pads 24.

As previously mentioned, the pins are insulated from each other, and a gas barrier is created in the interior of the package between the pin holding frame 34 and the substrate 14 by use of the non-permeable, non-electrically conductive adhesive 60, which may be a conventional insulating epoxy resin.

The back plate may be made of any one of a large number of metallic, organic or ceramic materials. The back plate must be constructed and arranged to provide physical support for the substrate, and further to provide a heat conductive path from outside of the package to the die. Materials such as aluminum or an aluminum alloy or beryllium may be employed. Preferably the thermal coefficient of expansion of the back plate material would match that of the substrate.

The adhesive 60 between the pin holder frame and the substrate is also chosen to have a controlled thermal coefficient of expansion to improve the matching of expansion characteristics of the pin holder frame and the substrate. Thus the adhesive 60 may be formed of an epoxy loaded with a suitable material, such as a titanium dioxide or microspheres so as to provide this adhesive with a thermal coefficient of expansion that is between that of the pin holder frame and that of the substrate.

Figure 3:
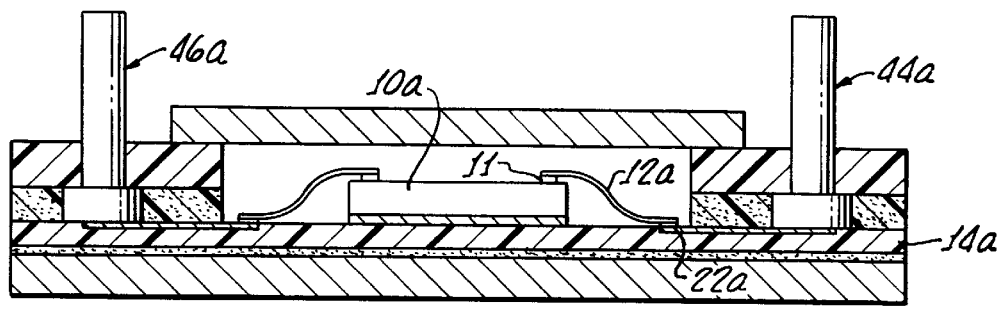
FIG. 3 illustrates a die package employing a different type of die connection.

The modular package concept set forth above can be applied to a leaded die in the manner illustrated in FIG. 3. This figure illustrates portions of the structure of FIG. 1, all of which are identical, but merely shows a different type of die on the substrate 14a. Thus, a leaded die 10a includes pads 11 and wires or leads 12a connected between the die pads and contacts 22a formed on the substrate. Contacts 22a are the die connecting contacts shown as contacts 22 of FIG. 2.

Figure 4:
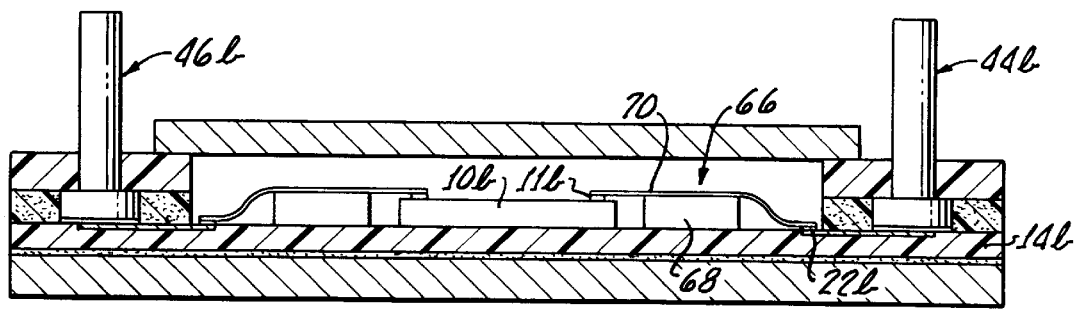
FIG. 4 illustrates a die package employing still another form of die connection.

In a tape automated bonding (TAB) die package the arrangement appears as shown in the view illustrated in FIG. 4, wherein a substrate 14b similar to substrate 14 of FIG. 1 is coupled with a pin holder frame, pins, back plate and lid, all of the type shown in FIG. 1. In this case, however, the die attachment would be different. Die 10b has pads 11b formed thereon and connected to pads 22b on the substrate by means of a tape automated bonding (TAB) structure 66. The TAB structure includes a substrate 68 onto which there is formed a pattern of electrically conductive traces 70 that are bonded to the die pads 11b at an inner end of the TAB. The TAB is a rectangular structure with an opening sufficient to receive the die. Thus it will be seen that the arrangement shown and described in detail in FIGS. 1 and 2 utilizing a die with a ball grid array is readily adapted to use with either the leaded or TAB dies shown in FIGS. 3 and 4.

Figure 5:
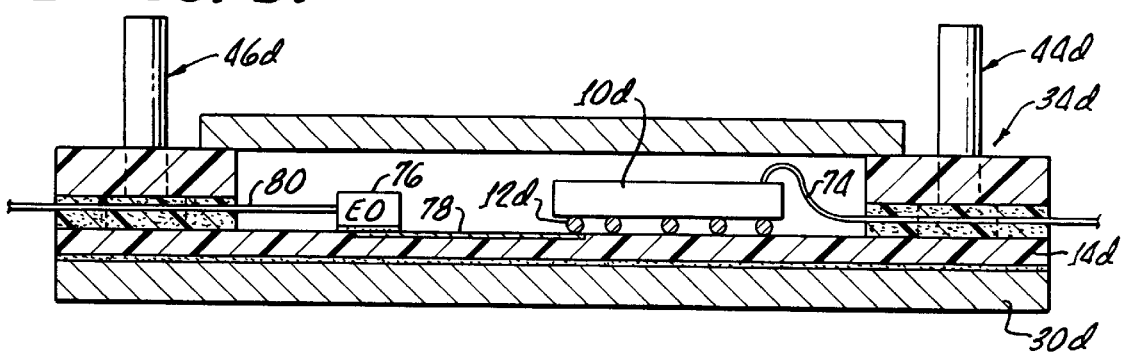
FIG. 5 illustrates a die package embodying electro-optic devices and optic fibers.

FIG. 5 illustrates an arrangement of the multiple pin die package which includes electro-optical devices. In this arrangement a die 10d having a ball grid array 12d electrically connected to pads on the substrate 14d also is formed with a plurality of optical fibers 74 (of which only one is shown in FIG. 5) which are readily passed from the die and through the package to its exterior between the pin holder frame 34d and the substrate 14d. The fibers thread their way through and between the heads of the pins, such as pins 44d and 46d, which are mounted in a pin holding frame 34d.

Also shown in FIG. 5 are a plurality of electro-optic devices 76, of which only one is shown in FIG. 5, that are mounted on the substrate 14d and connected by electrically conductive traces 78, formed on the substrate, to solder ball connections 12d of the die. Electro-optic devices provide an electrical signal output in response to receipt of an optical signal. The electro-optic devices are optically coupled to external equipment by additional optical fibers 80 extending from the electro-optic devices 76 and passing through the gap between the pin frame 34d and the substrate 14d, being threaded through and around the heads of the pins 44d and 46d. Where one or an array of electro-optic devices are mounted on the substrate around and closely adjacent to the periphery of the die 10d, the aperture in the pin holder frame would be enlarged to receive both the die and the electro-optic devices, the latter being bonded or otherwise suitably physically secured to the substrate.

The correspondingly numbered components of FIGS. 1, 2, 3, 4 and 5 may all be identical or substantially identical to one another.

The above described multi-pin package arrangements have a number of significant advantages. Electrical characteristics of the substrate can provide significant improvements in package characteristics. Because the substrate is a separate component of the package, manufactured through processes readily available to the die manufacturer, the entire wiring and electrical pattern of the traces on the substrate can be readily changed or uniquely designed with a short lead time. If performance characteristics of the die change and require change in electrical connections, such changes can easily be included into the readily manufactured single element circuit substrate of the package. This is an improvement that is not available with present day techniques without a greatly increased amount of package development time.

Furthermore, the die can be electrically tested before the full packaging process is completed, that is, before the lid is applied. Again, as mentioned above, the package is a modular package, made primarily of standard parts. Only the circuit substrate and its integrated circuit specific conductive pattern need be changed for different die designs. The same size, type and configuration of pins, pin holder frame, lid and back plate may be utilized with different die design. Of course, the pin characteristics, such as length and diameter and materials, may also be changed with ease. No mechanical connections are required since all elements are adhesively bonded.

The entire manufacture and assembly procedure (including fabrication of the circuit substrate) is relatively simple since all of the parts may be adhesively bonded. The procedure may be readily carried out in facilities using assembly equipment and procedures already employed by the die fabricator.

The use of substrate and back plate materials having a high heat transmissivity enables application of heat to the die for reflow soldering of ball grids or bonding of leaded dies without applying heat unnecessarily to the pins or pin holder frames, which, accordingly may be made of materials that are more sensitive to the heat employed in the die attach process.

I claim:

1. A method of fabricating an integrated circuit die package comprising the steps of:

forming a substrate including an inner side having a first group of die connecting pads, a second group of pin connecting pads, and a plurality of conductive traces interconnecting each of said die connecting pads to an individual one of said pin connecting pads, providing a pin holding frame having a plurality of pin receiving holes extending therethrough and having a central opening for receiving an integrated circuit die, providing a plurality of pins having substrate connecting ends, inserting said pins in individual ones of at least a group of said pin receiving holes of said pin holding frame, with said substrate connecting ends adjacent said substrate inner side, pressing said pin holding frame against said substrate inner side to effect electrical and physical contact between the substrate connecting ends of said pins and said pin connecting pads of said substrate, positioning an integrated circuit die on said substrate within said central opening of said pin holding frame, electrically connecting die contacts of said die to respective ones of said die connecting pads of said substrate, and covering said pin holder frame aperture to seal and enclose the die.

2. The method of claim 1 wherein said step of forming a substrate comprises forming the substrate of a thin layer and including the steps of providing a back plate having an area coextensive with at least a major portion of said substrate, and bonding said back plate to a side of said substrate opposite said pads and traces.

3. The method of claim 1 wherein said step of pressing the pin holding frame includes the step of applying a conductive adhesive to the substrate contacting ends of each of said pins.

4. The method of claim 2 wherein said die is provided with a plurality of die connecting solder balls on one side thereof and wherein said step of electrically connecting said die to said substrate includes applying heat to said die and to said solder balls through said back plate, said step of providing a back plate comprising the step of forming said back plate of a material having a high thermal conductivity.

5. The method of claim 1 wherein said step of forming a pin holding frame comprises the step of forming a universal pattern of pin receiving holes in said frame, and wherein said step of inserting pins in said pin receiving holes comprises the steps of inserting pins only in a selected plurality of said pin receiving holes.

6. The method of claim 1 wherein said step of inserting pins in said pin receiving holes comprises the steps of inserting pins in less than all of said holes.

7. The method of claim 1 wherein said step of providing a plurality of pins comprises forming each of said pins with a small diameter narrow shank and an enlarged diameter head that forms the pin substrate connecting end, and including the step of placing an electrically conductive adhesive on the head of each pin to enable the pins to be physically and electrically connected to the pin connecting pads of said substrate.

8. The method of claim 7 wherein said enlarged diameter head provides a space between said substrate and said pin holding frame, and including the step of depositing a non-electrically conductive and gas impermeable adhesive in said space.

* * * * *